US009704999B2

(12) United States Patent
Ma et al.

(10) Patent No.: US 9,704,999 B2
(45) Date of Patent: Jul. 11, 2017

(54) THIN FILM TRANSISTORS WITH TRENCH-DEFINED NANOSCALE CHANNEL LENGTHS

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 270 days.

(21) Appl. No.: 14/664,119

(22) Filed: Mar. 20, 2015

(65) Prior Publication Data
US 2017/0098715 A1    Apr. 6, 2017

(51) Int. Cl.
H01L 27/12    (2006.01)
H01L 29/786    (2006.01)
H01L 29/06    (2006.01)
H01L 29/66    (2006.01)
H01L 21/304    (2006.01)

(52) U.S. Cl.
CPC ...... *H01L 29/78618* (2013.01); *H01L 21/304* (2013.01); *H01L 29/0653* (2013.01); *H01L 29/66522* (2013.01); *H01L 29/66772* (2013.01); *H01L 29/78654* (2013.01); *H01L 29/78681* (2013.01)

(58) Field of Classification Search
CPC ............... H01L 21/304; H01L 29/0653; H01L 29/06522; H01L 29/66772; H01L 29/78654; H01L 29/78681

USPC ................................ 257/67, 69, 347, 353
See application file for complete search history.

(56) References Cited

U.S. PATENT DOCUMENTS 9,006,785 B2    4/2015  Ma et al.
2015/0287817 A1*  10/2015  Kubota .................. H01L 29/36
                                                       257/77

OTHER PUBLICATIONS

Ahn, S. H., et al., "Large-Area Roll-to-Roll and Roll-to-Plate Nanoimprint Lithography: A Step toward High-Throughput Application of Continuous Nanoimprinting," *ACSNano* vol. 3, No. 8, American Chemical Society, 2009, pp. 2304-2310.
Zhou, H., et al., "Fast flexible electronics with strained silicon nanomembranes," *Scientific Reports*, 3:1291, 2013, pp. 1-7.
Rogers, J. A., et al., "Synthesis, assembly and applications of semiconductor nanomembranes," *Nature*, vol. 477, Sep. 1, 2011, pp. 45-53.
Zhang, K., et al., "Fast flexible electronics using transferrable silicon nanomembranes," *J. Phys. D: Appl. Phys.*, vol. 45, 2012, pp. 1-14.
Yuan, H.-C., et al., "Thermally Processed High-Mobility MOS Thin-Film Transistors on Transferable Single-Crystal Elastically Strain-Sharing Si/SiGe/Si Nanomembranes," *IEEE Trans. Electron Devices*, vol. 55, No. 3, Mar. 2008, pp. 810-815.

(Continued)

*Primary Examiner* — Tan N Tran
(74) *Attorney, Agent, or Firm* — Bell & Manning, LLC

(57) ABSTRACT

Thin film transistors (TFTs), including radiofrequency TFTs, with submicron-scale channel lengths and methods for making the TFTs are provided. The transistors include a trench cut into the layer of semiconductor that makes up the body of the transistors. Trench separates the source and drain regions and determines the channel length of the transistor.

19 Claims, 13 Drawing Sheets

(56) References Cited

OTHER PUBLICATIONS

Kim, D-H., et al., "Stretchable, Curvilinear Electronics Based on Inorganic Materials," *Adv. Mats.*, vol. 22, 2010, pp. 2108-2124.
John, J., et al., "Large-area, continuous roll-to-roll nanoimprinting with PFPE composite molds," *Nanotechnology*, vol. 24, 505307, 2013, pp. 9 pages.

* cited by examiner

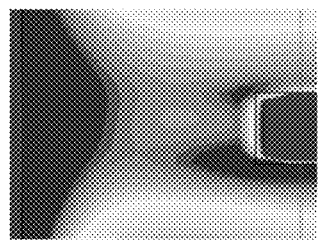 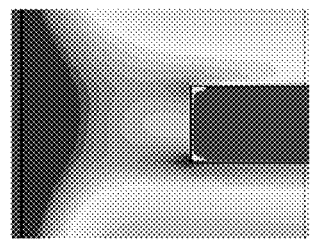 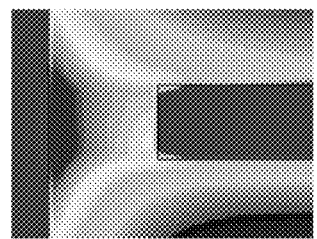
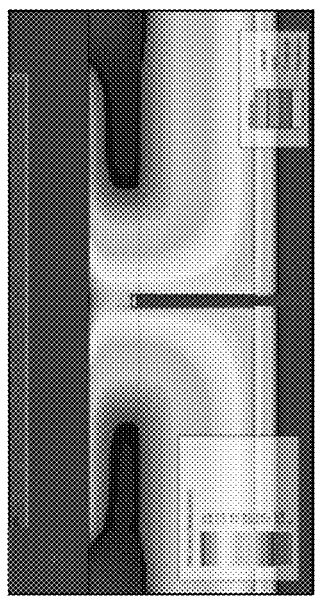 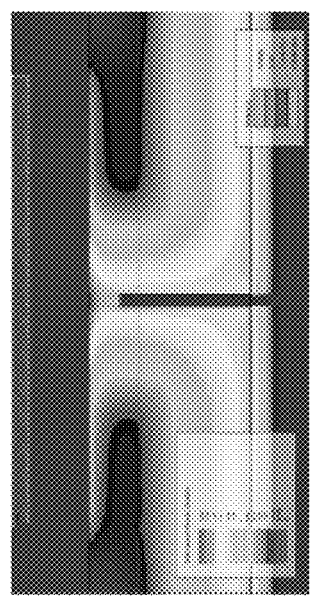 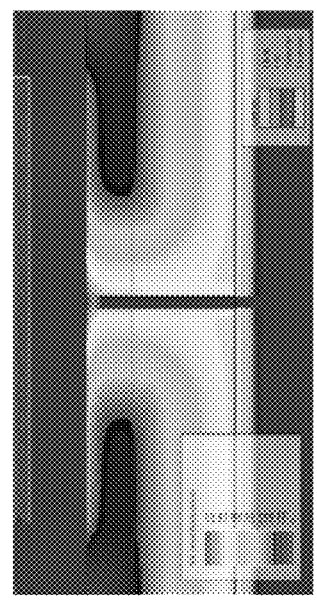
FIG. 4A — Depth: 200nm Width: 100nm
FIG. 4B — Depth: 220nm Width: 100nm
FIG. 4C — Depth: 250nm Width: 100nm

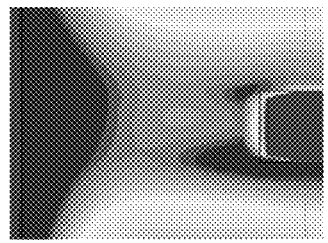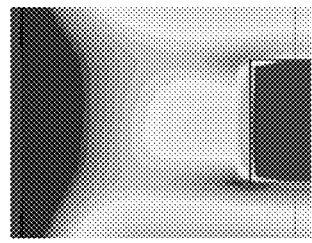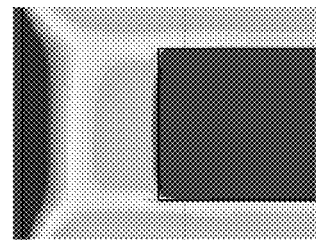
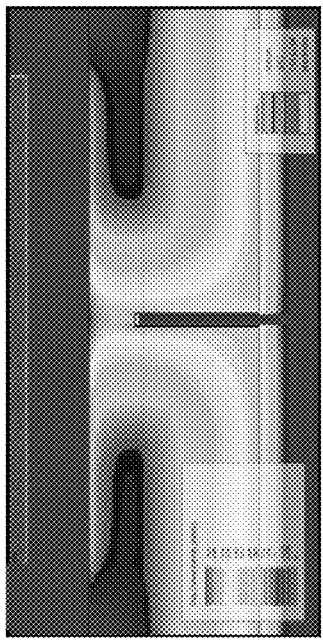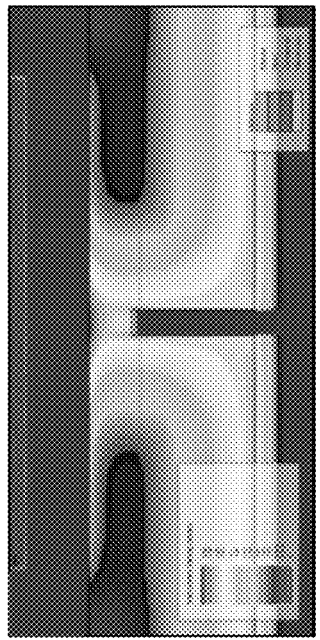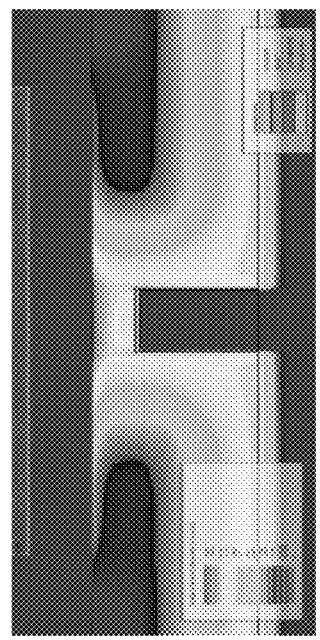
FIG. 5A — Depth: 200nm, Width: 100nm
FIG. 5B — Depth: 200nm, Width: 200nm
FIG. 5C — Depth: 200nm, Width: 500nm Table 1. Device Parameters and Figure-of-Merit Values

| | $g_{ms}$ (mS) | $\tau$ (psec) | $R_g$ (Ω) | $R_d$ (Ω) | $R_s$ (Ω) | $L_g$ (nH) | $L_d$ (nH) | $L_s$ (nH) | $C_{gd}$ (pF) | $C_{gs}$ (pF) | $C_{ds}$ (pF) | $R_{ds}$ (Ω) | $f_T$ (GHz) | $f_{max}$ (GHz) |
|---|---|---|---|---|---|---|---|---|---|---|---|---|---|---|
| 100nm TFT | 2.35 | 3.6 | 0.05 | 9.7 | 128 | 0.014 | 0.175 | 0 | 0.02 | 0.037 | 0.005 | 80 | 5 | 38 |
| 200nm TFT | 2.2 | 3.6 | 0.05 | 9.7 | 134 | 0.014 | 0.175 | 0 | 0.02 | 0.038 | 0.008 | 85 | 4.9 | 37 |
| 500nm TFT | 2.1 | 3.6 | 0.05 | 9.7 | 148 | 0.014 | 0.175 | 0 | 0.02 | 0.04 | 0.010 | 95 | 4.2 | 34 |

FIG. 8

THIN FILM TRANSISTORS WITH TRENCH-DEFINED NANOSCALE CHANNEL LENGTHS

REFERENCE TO GOVERNMENT RIGHTS

This invention was made with government support under FA9550-09-1-0482 and FA9550-08-1-0337 awarded by the USAF/AFOSR. The government has certain rights in the invention.

BACKGROUND

In recent years, flexible electronics have gained popularity with various applications ranging from flexible displays, wearable electronics and ID tags, and biomedical devices, to structural health monitoring. These applications in general do not require the use of very high speed devices, but the flexibility of the electronics is of critical importance. Typically, these low speed flexible electronics are based on organic or low temperature deposition-compatible amorphous semiconductors (e.g., Si) or metal oxide materials, which can be processed with large area printing, coating, and deposition techniques. Among them, roll-to-roll production is one of the most desirable fabrication methods, offering the benefits of high throughput and low cost. Several key steps in the process, such as patterning and thin-film deposition, have been successfully demonstrated on flexible substrates. In addition, some research groups have demonstrated active components with reasonably good DC performance using organic semiconductor materials. However, the devices reported operate at relatively low frequencies due to the low mobility of the semiconductor materials.

Radio-frequency (RF) capable transistors, due to their wider signal handling capability, can extend printed electronic applications toward RF data transmission and wireless power transfer or allow circuits to operate with lower power consumption. The main challenges in this pursuit include: (1) a lack of materials with sufficient mobility; and (2) difficulties in defining a fine channel region using a scalable fabrication process. Although several RF capable flexible field-effect devices fabricated using nanowires have been reported, the approach cannot be adapted for mass production. Furthermore, conventional nanoscale patterning techniques, such as e-beam lithography, cannot meet the requirements for mass production on flexible substrates.

SUMMARY

Thin film field effect transistors, including RF transistors, with submicron-scale channel lengths and methods for making the TFTs are provided.

One embodiment of a field effect transistor comprises: a layer of single-crystalline inorganic semiconductor comprising an first sublayer in which the semiconductor is n-type doped or p-type doped and a second, oppositely doped sublayer adjacent to the first sublayer; a trench bisecting the first sublayer and extending into the second sublayer to provide a source region in the first sublayer on one side of the trench, a drain region in the first sublayer on the opposite side of the trench, and a channel region in the second sublayer above the trench, wherein the channel region has a length corresponding to the width of the trench; a gate dielectric disposed on the channel region; a gate contact disposed on the gate dielectric; a source contact in electrical communication with the source region; and a drain contact in electrical communication with the drain region.

One embodiment of a method of making a field effect transistor comprises the steps of: forming a layer of single-crystalline inorganic semiconductor comprising: a first sublayer in which the semiconductor is n-type doped or p-type doped; and a second, oppositely doped sublayer adjacent to the first sublayer; forming a trench in the layer of single-crystalline inorganic semiconductor, wherein the trench bisects the first sublayer and extends into the second sublayer to provide a source region in the first sublayer on one side of the trench, a drain region in the first sublayer on the opposite side of the trench, and a channel region in the second sublayer above the trench, wherein the channel region has a length corresponding to the width of the trench; forming a gate dielectric on the channel region; forming a gate contact on the gate dielectric; forming a source contact in electrical communication with the source region; and forming a drain contact in electrical communication with the drain region.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4A shows the simulated current density for a TFT with a 200 nm deep trench, revealing that the majority of the current flows through the trench surface and field-effect controllability is weak.

FIG. 4B shows the simulated current density for a TFT with a 220 nm deep trench, revealing that gate controllability is improved but a leakage current is still present through the trench.

FIG. 4C shows the simulated current density for a TFT with a 240 nm deep trench, revealing a very strong field-effected channel without a leakage current.

FIG. 5A shows the simulated current density for a TFT with a 100 nm wide and 200 nm deep trench with a large leakage current near the trench surface.

FIG. 5B shows the simulated current density for a TFT with a 200 nm wide and 200 nm deep trench with a significantly reduced the leakage current.

FIG. 5C shows the simulated current density for a TFT with a 500 nm wide and 200 nm deep trench that is completely free from the leakage current.

FIG. 8. Table 1, comparing extracted device model parameters and figure-of-merit (FOM) values between TFTs with various trench widths.

DETAILED DESCRIPTION

Thin film field effect transistors, including RF transistors, with submicron-scale channel lengths and methods for making the TFTs are provided. The TFTs, which combine submicron-scale dimensions with high device performance, can be fabricated on flexible plastic substrates in high throughput, roll-to-roll processing schemes that combine nanoimprint lithography and thin film transfer techniques and enable the fabrication of arrays of TFTs over large areas. The p-channel versions TFTs are useful in a wide range of flexible RF electronics applications.

Figure 1:
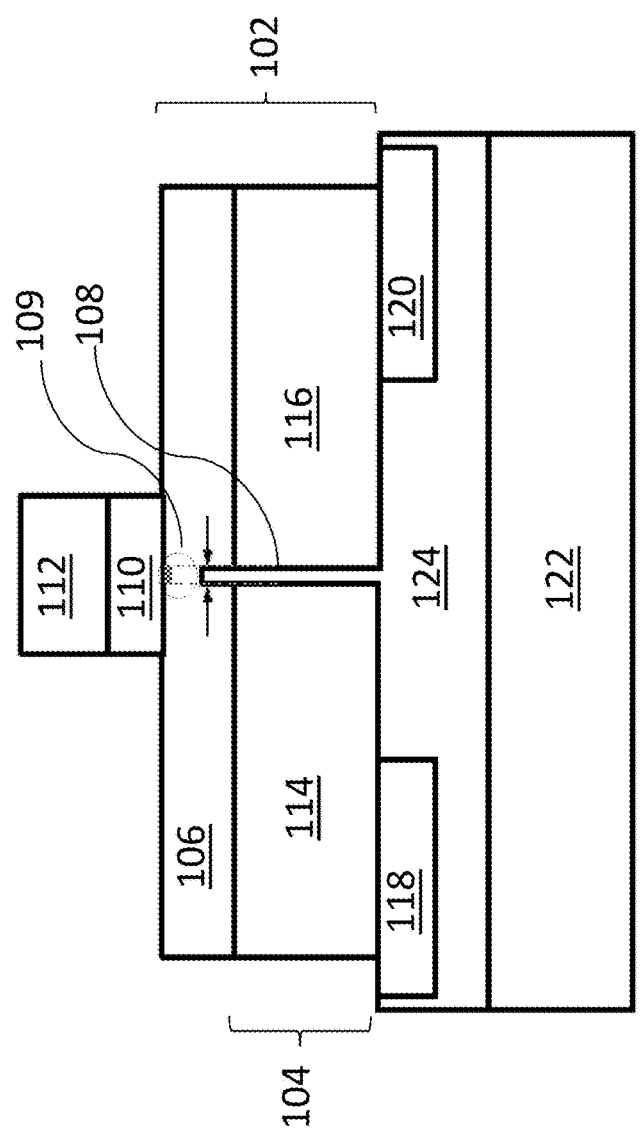
FIG. 1 is a schematic diagram of a thin film transistor (TFT).

A schematic illustration of an embodiment of a TFT is shown in FIG. 1. The TFT includes a layer of single-crystalline semiconductor 102 that includes a first sublayer 104 that is n-type or p-type doped and a second, adjacent, sublayer 106 that is oppositely doped. A trench 108 extends through sublayer 104, bisecting it, and into sublayer 106. The thinned region of single-crystalline semiconductor 102 remaining over the trench provides a channel region 109 in the TFT. (As used here, the term bisect indicates that the trench physically separates sublayer 104 into two parts. However, the two parts need not be equal in size.) The trench may optionally be fully or partially filled with an inert material—that is, a material that does not have a significant negative impact on the performance of the TFT. The inner surface of the trench may optionally be coated with a passivating material that suppresses surface leakage current. A source region 114 is defined in sublayer 104 on one side of trench 108 and a drain region 116 is formed on the other side of trench 108, opposite source region 114. A gate dielectric 110 is disposed on sublayer 106 over trench 108 and an electrically conducting (e.g., metal) gate contact 112 is disposed over gate dielectric 110. The TFT further includes a source contact 118 in electrical communication with source region 114 and a drain contact 120 in electrical communication with drain region 116. A substrate 122, which may be a mechanically flexible substrate, provides a support for the device. An adhesive layer 124 may be used to adhere the active components of the TFT to substrate.

The length of the channel region in the TFT is determined by the width of trench 108 and, therefore, is not determined by the gate length as it is in a conventional field effect transistor. Because the channel length is independent of the gate length, the channel can be very short—much shorter than the gate. The trench also provides the TFTs with a unique current flow path. Unlike a conventional transistor, in which current flows from the source to the drain in a direction parallel with the channel, the current in the present transistors initially flows upward from source 114 in sublayer 104, through channel region 109 in sublayer 106, and then downward into drain region 116 in sublayer 104. Thus, the path of the current runs both perpendicular and parallel to the channel layer as it passes from the source to the drain.

Figure 2:
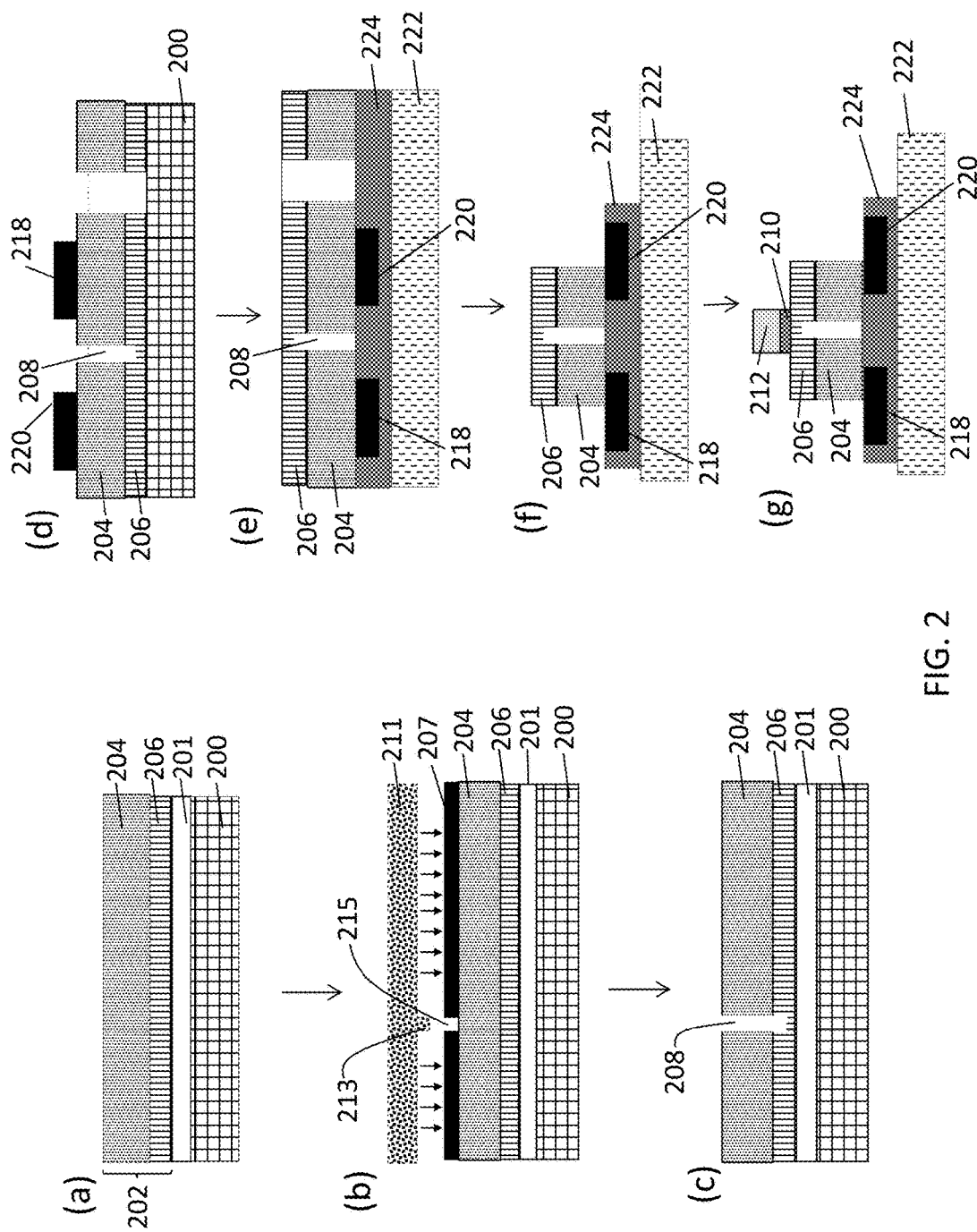
FIG. 2 is a schematic diagram of a method of making a TFT.

A schematic illustration of an embodiment of a method of making a TFT is shown in FIG. 2. As shown in panel (a), the TFT can be built from a semiconductor-on-insulator (SOI) that includes a handle layer 200, a sacrificial layer (such as a buried oxide, BOX, layer) and a single-crystalline semiconductor device layer 202. Device layer 202 is doped to form an underlying n-doped sublayer 204 and an overlying p-doped sublayer 206. (For the purpose of illustration, the fabrication of a p-channel TFT is described here. However, it should be understood that an n-channel TFT could be made using the same basic processing steps, but reversing the doping in sublayers 204 and 206.) Device layer 202 is desirably thin enough to be mechanically flexible. By way of illustration, the device layer may have a thickness of up to about 1 μm. For example, the device layer may have a thickness in the range from about 200 to about 500 nm. This includes embodiments in which the device layer has a thickness in the range from about 200 to about 300 nm. These thin layers of semiconductor are referred to as nano-membranes (NMs). A variety of semiconductors can be used as the device layer of the SOI, provided they are disposed on a sacrificial layer that can be selectively removed to release the device layer from the handle layer (as described below). Examples of suitable semiconductors include Groups IV semiconductors, such as Si, Ge and their alloys, including the alloys SiGe and SiGe:C. In an SOI the Group IV semiconductors can be disposed on a buried oxide that can be removed via selective etching. Other suitable semiconductors include Group III-V semiconductors and their alloys, such as InAs, InSb, GaAs, InP and InGaAs. Suitable sacrificial materials for these semiconductors include AlGaAs, AlAs and InP.

As shown in panels (b) and (c) of FIG. 2, nanoimprint lithography is used to cut a trench 208 through n-doped sublayer 204 and into, but not through, p-doped sublayer 206. The process begins by coating the exposed surface of n-doped sublayer 204 with a resist 207. Resist 207 is then embossed by a mold 211 having a relief pattern that includes an extension 213 that forms an indentation 215 in resist 207. Mold 211 is removed and trench 208 is then cut (e.g., etched) into device layer 202 at the site of indentation 215. Finally, the residual resist 207 is removed.

Device layer 202 is then released from handle layer 200 by selectively removing (e.g., etching away) sacrificial layer 201, such that device layer 202 settles onto handle layer 200 (panel (d)). Source and drain contacts 218 and 220 are formed on the two parts of n-doped sublayer 204 that are separated by trench 208. The contacts may be formed before or after the release of device layer 202. The contacts comprise an electrically conductive material, typically a metal. Released device layer 202 is then removed from handle layer 200 by contacting the exposed surfaces of device layer 202 and source and drain contacts 218 and 220 with a TFT substrate 222, which may be a flexible polymeric substrate, and lifting the structure away from the handle layer. An adhesive coating 224 on the surface of TFT substrate 222 may be used to facilitate the transfer. As shown in panel (e) of FIG. 2, after the transfer to TFT substrate 222, the surface of p-doped layer 206 that was previously attached to sacrificial layer 201 is now exposed. The perimeter of the TFT active region then can be isolated and defined, and source and drain contacts 218 and 220 can be exposed using, for example, a dry etch (panel (f)). Finally, a gate dielectric 210 can be formed on p-doped sublayer 206 over trench 208 and a gate contact 212 can be formed on gate dielectric 210, as shown in panel (g).

The width and depth of the trench can be selected such that leakage current in the transistor is minimized or eliminated. Generally, a deep trench, which provides a thin channel region, reduces leakage current because the current is more effectively drawn to the semiconductor/gate dielectric interface by the gate field. Wider trenches are also favored because leakage current is reduced as most of the current flows through the channel region near the semiconductor/gate dielectric interface. However, trench dimensions, such as trench width, can also affect the transistor characteristics, such as the cutoff frequency ($f_T$) and the maximum frequency of oscillation ($f_{max}$). Therefore, the dimensions of the trench can be selected to provide transistor performance characteristics appropriate for the intended application of the device. In some embodiments of the TFTs the trench has a width in the range from about 10 nm to about 1 µm. This includes TFTs in which the width of the trench is in the range from about 50 nm to about 1 µm, further includes TFTs in which the width of the trench is in the range from about 100 to about 600 and still further includes TFTs in which the width of the trench is in the range from about 450 to about 550 nm. In some embodiments of the TFTs the distance between the end of the trench and the opposing surface of the single-crystalline semiconductor (that is, the thickness of the single-crystalline semiconductor above the trench) is in the range from about 5 nm to about 80 nm. This includes embodiments in which the thickness of the single-crystalline semiconductor above the trench is in the range from about 10 nm to about 80 nm, further includes embodiments in which the thickness of the single-crystalline semiconductor above the trench is in the range from about 5 nm to about 45 nm, and still further includes embodiments in which the thickness of the single-crystalline semiconductor above the trench is in the range from about 20 nm to about 40 nm.

As noted previously, the effective channel length in the present TFTs is not determined by the gate length. As a result, the channel length can be much smaller than the gate length. In some embodiments, the channel length, which corresponds to the trench width, is no more than 50%, no more than 30% or no more than 10% as long as the physical length of the gate. However, because a shorter gate can enhance transistor performance, the transistors desirably have gate lengths no greater than about 1 µm.

The figures of merit $f_T$ and $f_{max}$ can be used to assess the performance of the TFTs. Some embodiments of the TFTs have an $f_T$ of at least 4 GHz. This includes TFTs having an $f_T$ of at least 4.5 GHz and further includes TFTs having an $f_T$ of at least 5 GHz. Some embodiments of the TFTs have an f max of at least 32 GHz. This includes TFTs having an $f_{max}$ of at least 35 GHz and further includes TFTs having an $f_{max}$ of at least 38 GHz. Methods for determining of the $f_T$ and $f_{max}$ for a transistor are described in the Example that follows.

EXAMPLE

This example illustrates high performance flexible TFTs fabricated on a plastic substrate using NIL technology in combination with silicon nanomembrane (Si NM) transfer printing. In order to have high enough mobility for TFTs to operate in the RF regime, Si NMs created from a silicon-on-insulator (SOI) wafer were employed instead of organic and amorphous semiconductor materials. The Si NMs have good flexibility and durability, similar to organic materials, but also have superior mobility. These techniques can be adapted to a high-throughput roll-to-roll process to produce large-area and high performance flexible electronics economically.

Figure 3A:
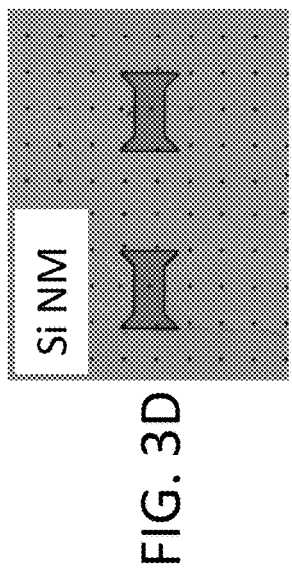
FIG. 3A is a microscopic image of a partially completed TFT after a nanoscale trench has been defined in the boron-doped, p-type device layer of an semiconductor (Si)-on-insulator (SOI) substrate.
Figure 3B:
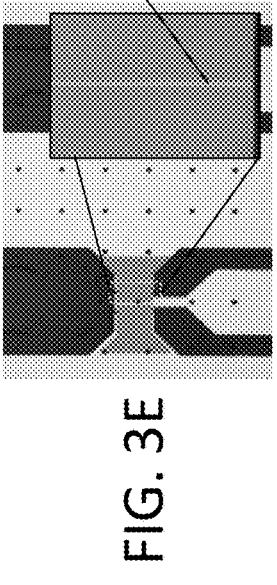
FIG. 3B is a microscopic image of a partially completed TFT after dry etching to bisect the n-type sublayer in order to form a path of n+/p−/n+ from the source to the drain.
Figure 3C:
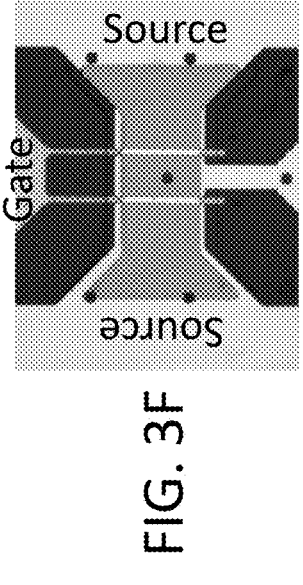
FIG. 3C is a microscopic image of a partially completed TFT after undercutting the buried oxide to release the silicon nanomembrane (Si NM), which forms the active region, and forming the source and drain contacts.
Figure 3D:
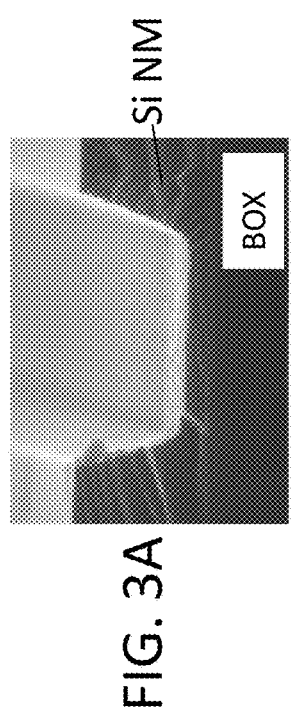
FIG. 3D is a microscopic image of a partially completed TFT after it has been flip transferred onto an adhesive coated plastic substrate.
Figure 3E:
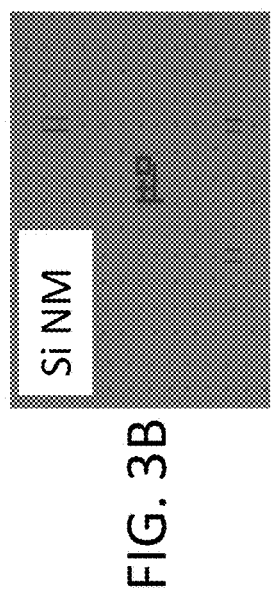
FIG. 3E is a microscopic image of a partially completed TFT after dry etching to define the perimeter of the active region.
Figure 3F:
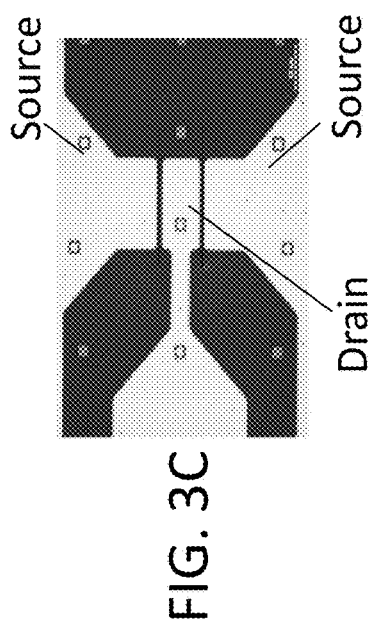
FIG. 3F is a microscopic image of a partially completed TFT after the deposition of an $Al_2O_3$ gate dielectric layer and gold gate contact above the trench.

FIGS. 3A-3F show microscope images of the device during various stages of the fabrication process. Since these studies are geared toward the fabrication of large-area high performance flexible electronics, all of the device fabrication processes were designed to be carried out at low temperatures (lower than 200° C.), except the first doping and recrystallization step. The detailed process conditions can be found in the Method section of this example. Briefly, phosphorus ions were implanted in a lightly doped p-type device layer of the SOI wafer to make the sublayer adjacent to the surface (down to a depth of 180 nm) n-type doped while the rest of the device layer (180 nm to 270 nm) remained lightly p-type doped. Nanoscale trenches were defined in the device layer by NIL followed by dry etching to separate and define a n+/p−/n+ current paths from a drain to a source (FIGS. 3A and 3B). Thereafter, the top Si device layer (i.e., the Si NM) was released and the source/drain contacts were defined (FIG. 3C). The device was subsequently flip transferred onto an adhesive coated polyethylene terephthalate (PET) substrate (FIG. 3D). Since all of the layers were flipped, the source/drain contacts were now positioned under the Si NM layer. The final fabrication steps involved additional dry etching to isolate/define the channel region (FIG. 3E) and deposition of the gate and gate dielectric layers (FIG. 3F).

When the effective channel length in conventional TFTs becomes narrower, the device suffers several physical issues. For example, when the effective channel length becomes nanoscale, a short channel effect is seen. However, the present TFTs not only offer structural advantages (the effective channel length is decided by the width of trench), but also circumvent aforementioned issues. The NIL defined trenches create unique current paths from source to drain. In contrast to conventional TFTs in which the current flows only parallel to the channel layer, the current in the present TFTs flows in a direction perpendicular to the channel layer, on its way from the source to the drain, under the gate dielectric layer. The current originates from the n+ well (for an NMOS device) in conventional TFTs, but the present device uses a partially n+ heavily doped layer in the p– Si NM layer as a starting point for the current's flow. Since the n+ layer was cut by a NIL defined trench, the current flows flow near the trench and is controlled by the electric field of a gate metal.

Two dimensional (2D) device simulation results under a bias condition (2 V to the gate and drain) are shown in FIGS. 4A-4C and 5A-5C to illustrate the path of the current flow. FIGS. 4A-4C show the simulated current density for trench depths of 200 nm, 220 nm and 250 nm, respectively. Darker regions along the current path represent a higher current density. It should be noted that the n+/p– junction in the Si NM was about 180 nm deep, such that the 50 nm thick p– channel region was separated only by 20 nm to the n+ layer for the 200 nm trench Si NM, while the 20 nm thick p– channel region was separated by 70 nm to the n+ layer for the 250 nm trench Si NM. The depth of the etched trench affected the efficiency of the current flow, as shown with 200, 220, and 250 nm trenches in the simulation. When the trench was 200 nm deep, a leakage current was observed near the upper part of the trench surface (FIG. 4A). Although most of the current was drawn to the Si NM/oxide interface by the gate field, some of the current flowed without passing through the channel but still flowed through the trench surface. When the trench was 220 nm deep, the leakage current began to decrease (FIG. 4B), and when the trench reached 240 nm deep, only 30~35 nm of Si NM remained in the channel, showing well-suppressed leakage current (FIG. 4C). Thus, it is desirable to etch a trench with precise depth to enhance the gate controllability and minimize the leakage current. FIGS. 5A-5C show the simulated current density near the channel region in devices with trench widths of 100 nm, 200 nm and 500 nm, respectively, with the depth fixed at 200 nm, which is the worst case as shown in FIGS. 4A-4C. As the trench became wider, the leakage current was minimized and the majority of the current flowed through the channel region. It was also observed that the channel became thinner as the width of the trench became wider. Overall, it was shown that the TFTs with narrower and shallower trenches show more leakage current due to the thicker channel region and the weaker field-effect controllability. Thus, for this embodiment of a TFT it was desirable to etch the trench precisely at about 240~250 nm deep to get the saturated current characteristics in TFTs.

Figure 6B:
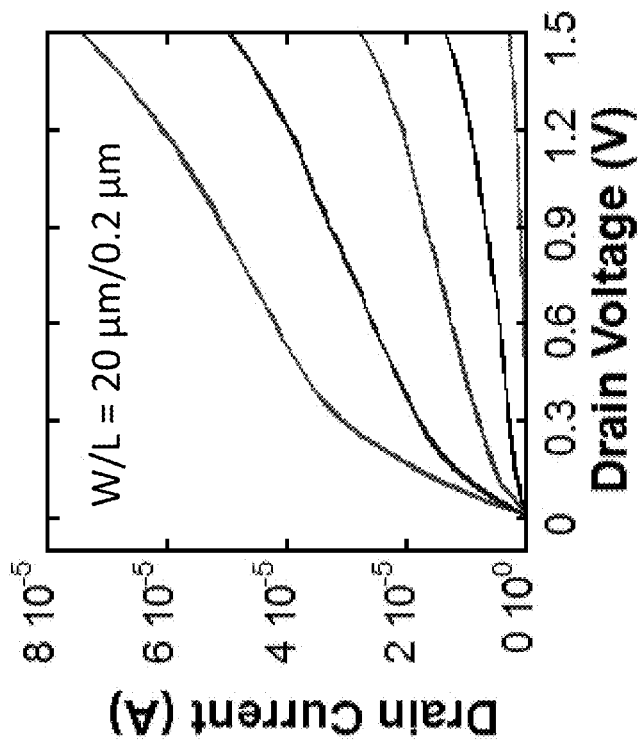
FIG. 6B. shows the $I_d$-$V_{ds}$ output curves for a TFT with a channel width and length of 20 μm and 200 nm, respectively.
Figure 6A:
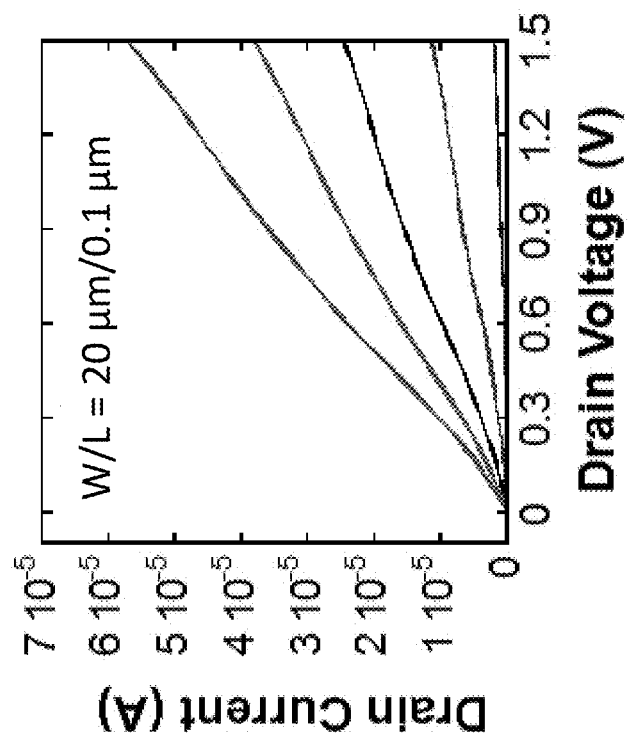
FIG. 6A. shows the $I_d$-$V_{ds}$ output curves for a TFT with a channel width and length of 20 μm and 100 nm, respectively.
Figure 6D:
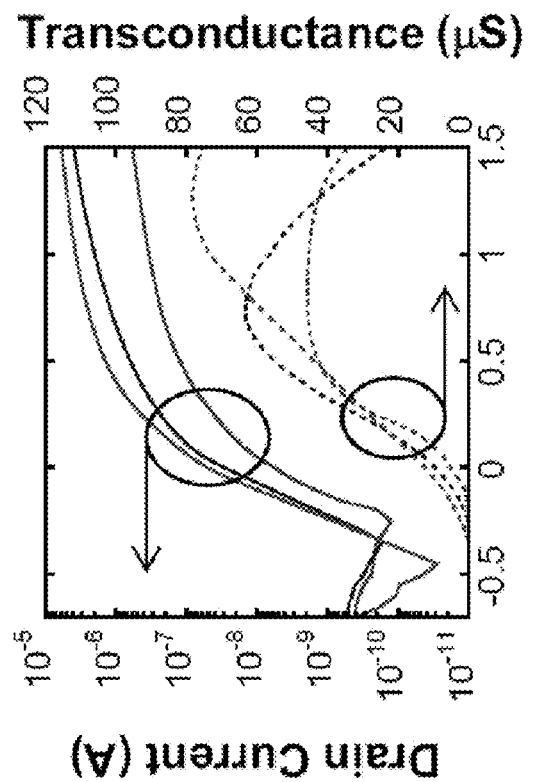
FIG. 6D shows the merged $I_d$-$V_{gs}$ transfer curves and transconductance for the TFTs of FIGS. 6A-6C.
Figure 6C:
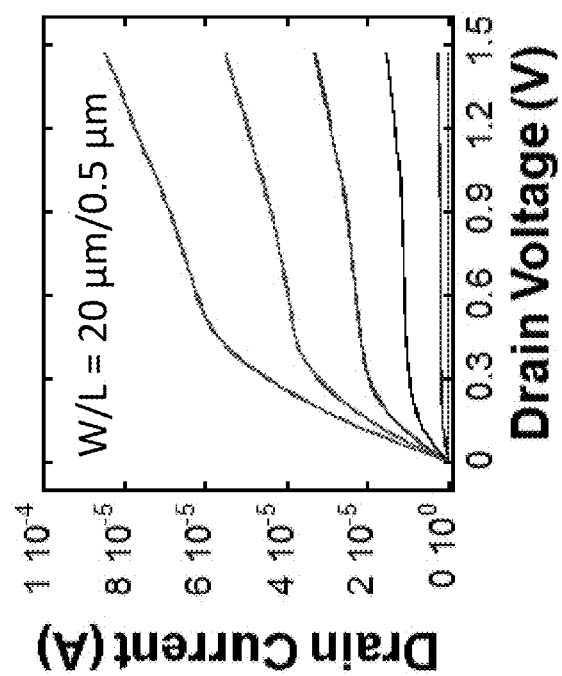
FIG. 6C. shows the $I_d$-$V_{ds}$ output curves for a TFT with a channel width and length of 20 μm and 500 nm, respectively.

A comparison of transfer and output characteristics for TFTs with various trench widths (100 nm, 200 nm, and 500 nm) is shown in FIGS. 6A-6C. The output curve ($I_{ds}$-$V_{ds}$) for a TFT with a 100 nm trench width showed poor saturation, as shown in FIG. 6A, which agreed well with the simulated current density shown in a FIG. 4A. As the trench width increased to 200 nm it more closely approached saturation (FIG. 6B) and at a trench width of 500 nm the drain current began to saturate (FIG. 6C). The on-state currents, as the trench got wider, increased from 57 µA to 80 µA at a $V_{ds}$ of 1.5 V. The transfer curves for all three cases, with $V_{ds}$=0.1 V, are plotted in FIG. 5D. The peak transconductance of the devices increased approximately two-fold, from 45 µS to 80 µS, as the trench widened from 100 nm to 500 nm, which was ascribed to the improved conductivity of the stronger field-effect in the channel region. As shown in a FIG. 4A, TFTs with 100 nm trench widths had a relatively short channel region with a graded current density distribution which means that the electron movement could be easily limited by such a drastic change in the field-effect. On the other hand, TFTs with a 500 nm trench width had a uniform current density distribution. This phenomenon also agreed well with the calculated field-effect mobility. The field-effect motilities for the TFTs with trench widths of 100, 200, and 500 nm were 56, 150, and 460 cm/V·s, respectively, and were extracted according to the following equation, $$\mu = (L_g \cdot g_m)/(W_g \cdot C_{ox} \cdot V_{ds})$$

where $L_g$ and $W_g$ were the gate length and width, and $g_m$ and $C_{ox}$ were the transconductance and oxide capacitance, respectively. As shown in FIGS. 5A-5C, a narrower trench led to a higher inversion layer charge density. The low mobility in the narrow trench TFTs may be primarily due to the low transconductance and higher channel sheet charge density (Q), $$Q_n = q \cdot x \cdot N_{INV},$$

in which $N_{INV}$ was the inversion charge number density, and thus the mobility (µ) was $$\mu = (L_g \cdot g_m)/(W_g \cdot Q_n).$$

Figure 6E:
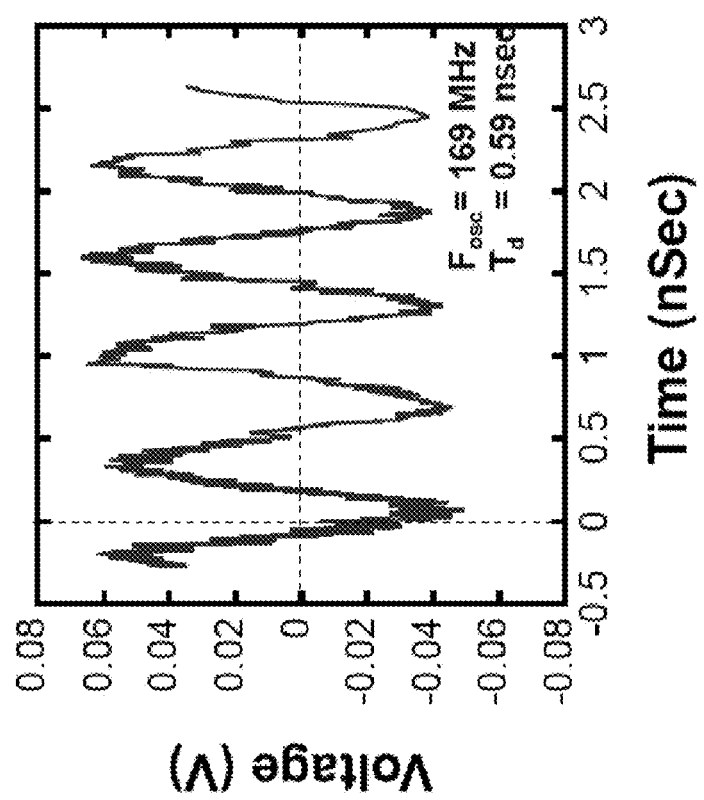
FIG. 6E shows the measured voltage—time characteristic showing a $f_{osc}$ of 169 MHz and a $t_d$ of 0.59 nsec.

The subthreshold swing (SS=d($V_{gs}$)/d log($I_{ds}$)) values of 330, 280, and 170 mV/dec were calculated from the linear portion of the log($I_{ds}$) versus $V_{gs}$ plot from the TFTs with 100, 200, and 500 nm wide trenches, respectively. The subthreshold swing in TFTs with 100 nm trench widths was relatively large and was possibly due to the unpassivated channel surface or to the weak short channel effect by inaccurate trench depth. However, despite the low channel concentration, the subthreshold leakage was well-suppressed compared to other nanowire-based RF FETs. (See, Wang, C. et al. Self-Aligned, Extremely High Frequency III-V Metal-Oxide-Semiconductor Field-Effect Transistors on Rigid and Flexible Substrates. *Nano Lett.* 12, 4140-4145 (2012).) FIG. 6E shows the measured wave form at a supply voltage ($V_{DD}$) of 2 V. The oscillation frequency and corresponding stage delay were 169 MHz and 0.59 ns, respectively.

Figure 7A:
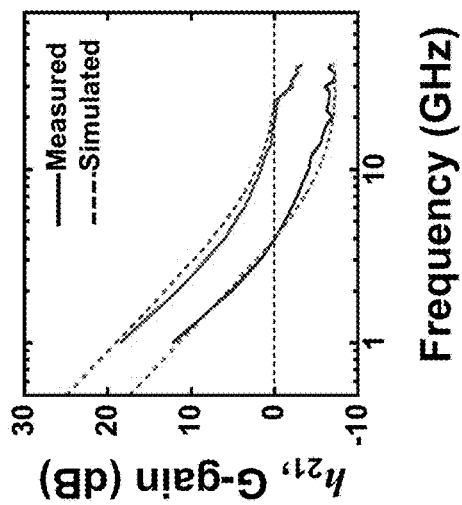
FIG. 7A shows the gain ($h_{21}$) and power gain ($G_{max}$) as a function of the frequency for a Si NM-based TFT with a 100 nm wide trench.
Figure 7B:
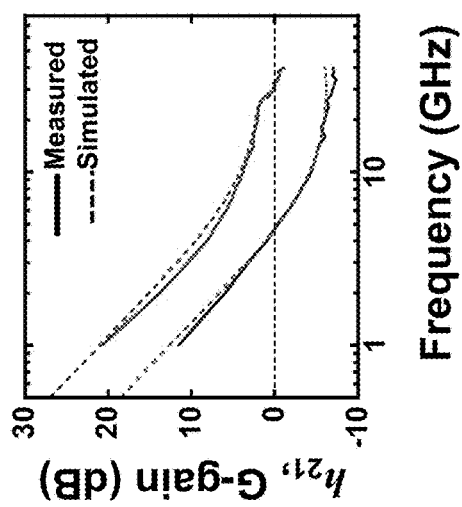
FIG. 7B shows the gain ($h_{21}$) and power gain ($G_{max}$) as a function of the frequency for a Si NM-based TFT with a 200 nm wide trench.
Figure 7C:
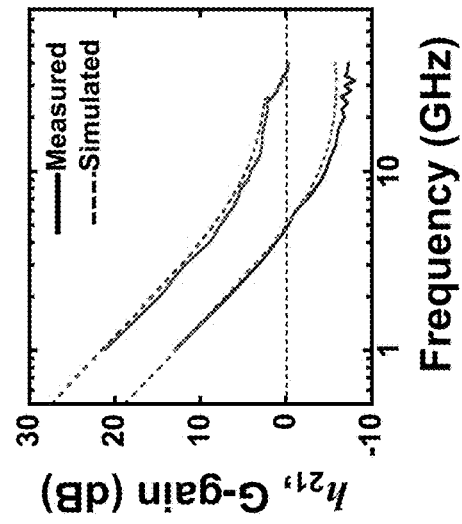
FIG. 7C shows the gain ($h_{21}$) and power gain ($G_{max}$) as a function of the frequency for a Si NM-based TFT with a 500 nm wide trench.

FIGS. 7A-7C present current gain ($h_{21}$) and maximum stable/available gain (MSG/MAG) derived from the measured S-parameters at a $V_{ds}$ of 1.5 V and a $V_g$ of 0.6 V for TFTs with 100 nm and 200 nm wide trenches, and a $V_{ds}$ of 1.2 V for a TFT with a 500 nm wide trench, respectively. The $f_T$ and $f_{max}$ were measured at 5 and 38 GHz for a TFT with a 100 nm wide trench, 4.9 and 37 GHz for a TFT with a 200 nm wide trench, and 4.2 and 34 GHz for a TFT with a 500 nm wide trench. FIG. 7B shows that there was reasonable agreement between the measured and simulated $f_T$ and $f_{max}$ values for the devices. The RF characteristics were further analyzed by employing a small-signal equivalent circuit model, the ADS2013 (Agilent Technology), to extract each parameter from the measured S-parameters at the bias conditions where the highest frequency responses were measured (FIG. 4H). The extracted figure-of-merit (FOM) values among TFTs with various trench widths are summarized in Table 1 in FIG. 8. The value of $C_{gs}+C_{gd}$ from the RF analysis yielded about 23 to 30 fF, which was comparable to that determined from direct measurements of $f_T$ and $g_m$. The $f_T$ value of ~5.5 GHz was extracted using the following equation.

$$f_T \approx g_m/[2\pi(C_{gs}+C_{gd})].$$

Figure 7E:
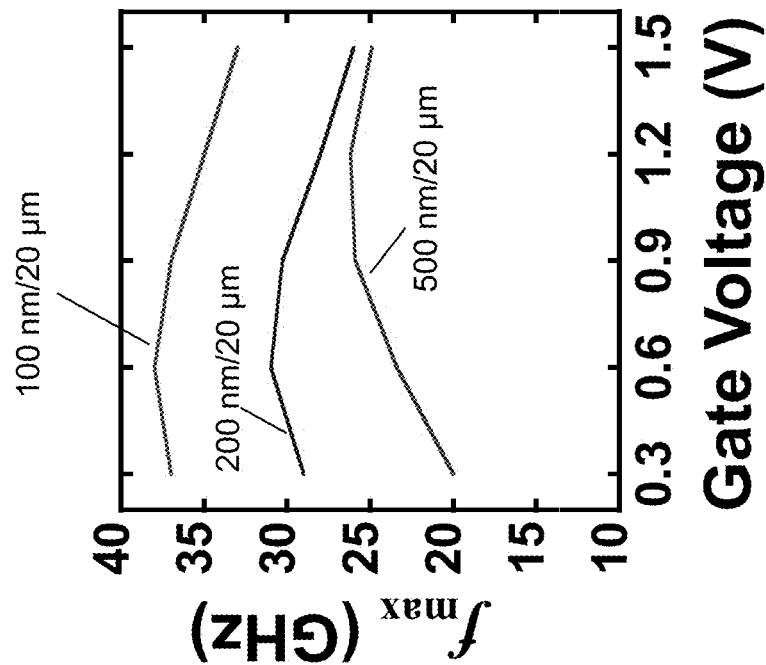
FIG. 7E shows $f_{max}$ as a function of gate bias under a fixed drain bias ($V_{ds}$=1.5 V) and as a function of drain bias under a fixed gate bias ($V_g$=0.6 V for a Si NM-based TFT with a 100 nm or 200 nm wide trench; $V_g$=1.2 V for a Si NM-based TFT with a 500 nm wide trench).
Figure 7D:
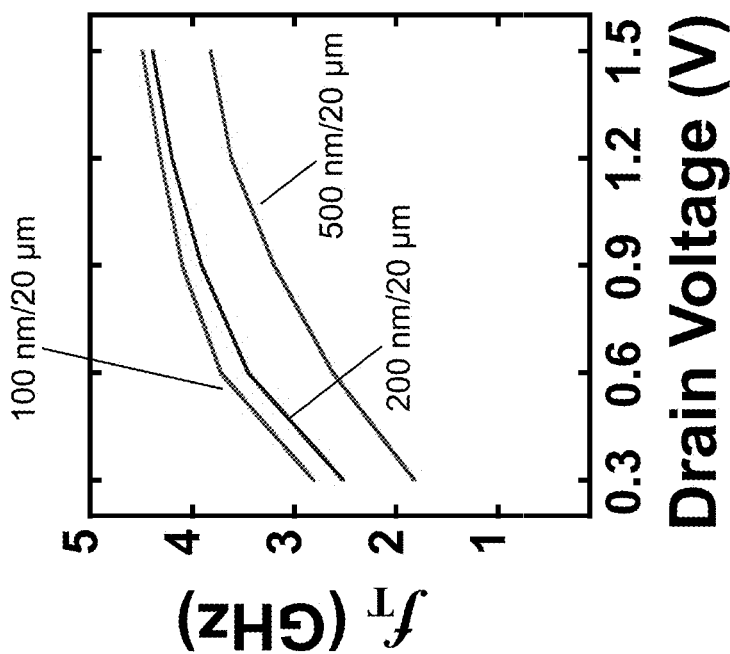
FIG. 7D shows $f_T$ as a function of gate bias under a fixed drain bias ($V_{ds}$=1.5 V) and as a function of drain bias under a fixed gate bias ($V_g$=0.6 V for a Si NM-based TFT with a 100 nm or 200 nm wide trench; $V_g$=1.2 V for a Si NM-based TFT with a 500 nm wide trench).
Figure 7G:
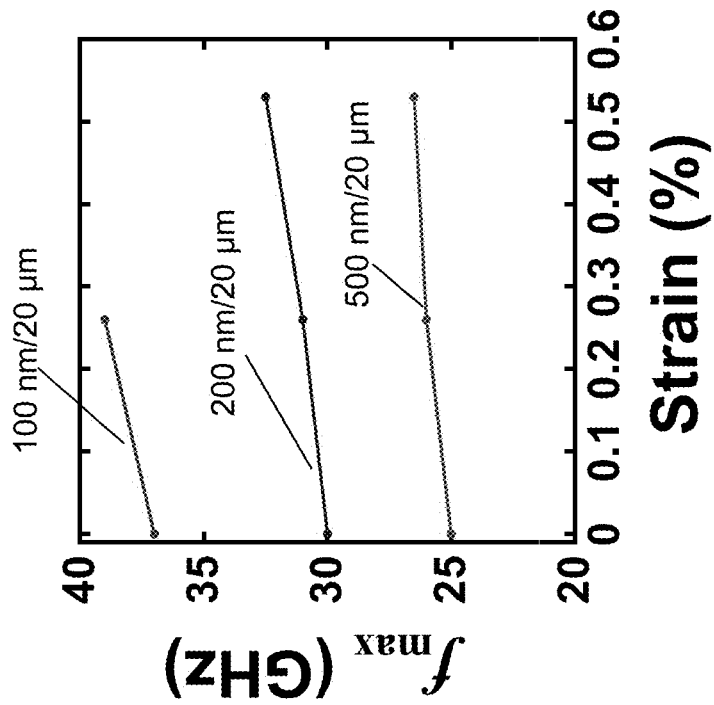
FIG. 7G shows $f_{max}$ as a function of bending induced external strain.
Figure 7F:
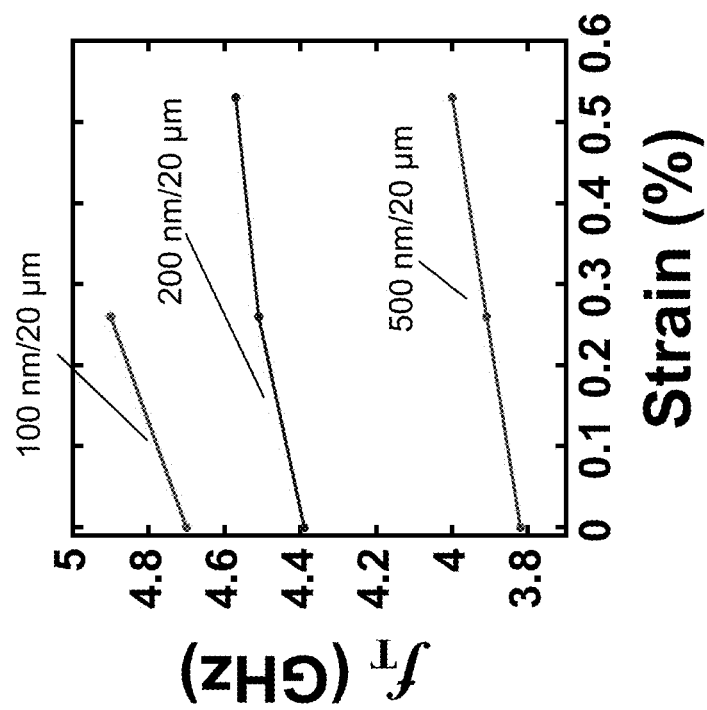
FIG. 7F shows $f_T$ as a function of bending induced external strain.
Figure 7H:
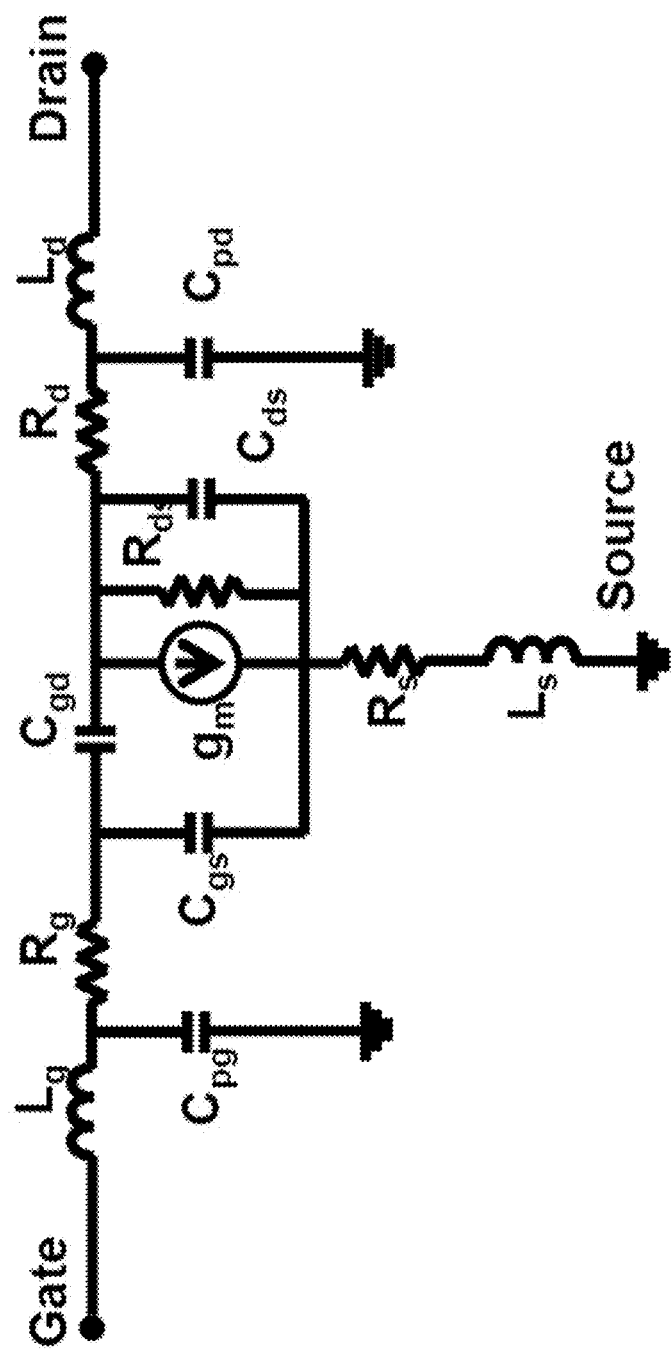
FIG. 7H shows the small-signal equivalent circuit model used for TFT parameter extraction.

This measured value agrees well with the measured $f_T$. As shown in FIG. 7D, $f_T$ increased with an increase of the drain biases. On the other hand, as shown in FIG. 7E, $f_{max}$ showed smaller changes with a change of gate biases. FIGS. 7F and 7G show the measured $f_T$ and $f_{max}$ variation trend as a function of tensile strain (it was not possible to measure frequency response under concave bending due to large RF probe size in the setup), which was consistent with that of the previous result. (See, Kang, M. -G., & Guo, L. J. Nanoimprinted Semi-Transparent Metal Electrode and its Application in OLED, *Adv. Mater.* 19, 1391-1396 (2007).) It is noted that the transistors remained intact and operational under high-strain conditions; a convex radius of curvature of 28.5 mm translated into an external strain of 0.55%. However, as indicated in a mechanical bending simulation, strain concentrated near the corner of the trench under bending conditions, which rendered it a weak point in the structure. However, this could be improved by applying additional layers to make the Si NM layer lay on the neutral plane.

Under the bending condition, the strain was concentrated on the trench area because the trench was just 100 nm~500 nm wide and 30-35 nm thick. Mechanical simulation by Ansys™ also showed that the channel region (i.e., the trench area) had more strain than the peripheral region. This can further increase the mobility in Si NM.

Simulation with the typical scaling law of field effect transistors was carried out to further investigate the potential of the device. The $f_T$ value increased to 25 GHz by ~45% intended misalignment to the drain.

The RF characteristics were simulated by Silvaco™ Atras. With an optimal device structure, a 100 nm wide by 240 nm deep trench with a 1 µm gate length without a gate to the source and drain overlap, $f_T$ and $f_{max}$ can ideally exceed 16 GHz and 100 GHz, respectively. The $f_T$ and $f_{max}$ are so sensitive to the device parameters that the $f_T$ and $f_{max}$ can easily be lowered if one uses a wider gate length or gate to the source and drain overlap distance. Interestingly, it was found that misalignment of the gate electrode can further enhance the RF characteristics. This improvement occurs because intentional misalignment corrects the asymmetrical current density distribution. When the gate electrode is perfectly aligned with the trench, the current distribution is not symmetric. Such an asymmetric distribution worsens when the gate electrode is misaligned to the left; but when it misaligned to the right (to the drain), the distribution of current density becomes symmetric. As a result, the total effective resistance from source to drain is reduced and this can be attributed to the improvement of $f_T$ and $f_{max}$.

In conclusion, this example shows a viable approach for fabricating high performance flexible Si NM TFTs using NIL technology. By applying the NIL process to define a deep-submicron channel, it is possible to realize the flexible and RF-capable Si NM TFTs whose performance is comparable to the best existing flexible RF transistors using nanowires or III-V semiconductors. In addition, this unique device structure combined with NIL technology can offer practical routes for mass production of high performance flexible RF active components/systems with nanoscale channels defined by a large area roll-to-roll NIL process at a lower cost.

Method

Fabrication started with phosphorus doping via ion implantation everywhere on a silicon-on-insulator (SOI) wafer (from Soitec) with a lightly doped ($4\times10^{15}$ cm$^{-3}$) p-type 270 nm top Si layer. Prior to ion implantation, a 30 nm thick SiO$_2$ layer was deposited as a screen layer by sputtering. The ion implantation was carried out at an energy level of 10 keV and a dose of $5\times10^{16}$ atoms/cm$^2$ at a 7° incident angle at room temperature. This was followed by a recrystallization process in the furnace at 900° C. for 20 min under nitrogen ambient. During the annealing process, phosphorus ions were diffused and formed a 180 nm deep n+ layer (at a peak doping level of $1\times10^{20}$ cm$^{-3}$) on the p- layer surface.

Phosphorus doping was carefully simulated with Silvaco™ using the Monte Carlo method. In this device, formation of a n+/p- junction with a depth of 180~200 nm was key. A simulated graphical distribution of implanted ions was obtained using 10 KeV of energy and $5\times10^{16}$ atoms/cm$^2$ of dose. The results showed that a Gaussian distributed, heavily doped n+ layer that was obtained after annealing at 900° C. for 20 minutes in the furnace. Based on these simulation results, a p-n junction was expected to be formed at a depth of 180 nm. A n+/p- test diode was fabricated. 220~230 nm of Si was etched out of a 270 nm thick Si NM to expose the p- layer. The I-V characteristic showed good rectifying characteristics and confirmed the formation of the p-n junction.

For the thermal NIL processes, pressure and temperature were the two most important parameters that determine the quality of the NI patterns. A mr-I-7020E nanoimprinting photoresist (from Micro Resist Technology) was used and an NIL process was carried out using a thermal imprinting system (Obducat AB NIL 2.5" Nanoimprinter). The sample for the NIL process should be heated over the glass transition temperature ($T_g$) before it is pressed. When detaching the sample, however, the temperature should be lowered first and then raised to $T_g$ before releasing the pressure. Adding several transient pressure and temperature steps also helps detach a mold from the substrate.

To make the detaching-step easy, the surface of the imprinting mold was chemically treated with a self-assembled monolayer of a fluorosilane release agent (1H,1H, 2H,2H-perfluorodecyl-trichlorosilane) using the chemical vapor deposition (CVD) method at 140° C. (See, Guo, L. J. Nanoimprint lithography: methods and material requirements. *Adv. Mater.* 19, 495-513 (2007).) After completion of the imprinting step, and detaching the mold from the SOI substrate, a weak oxygen plasma treatment was carried out using reactive ion etching (RIE, Unaxis 790) for descumming the photoresist to fully expose the imprinting patterned regions on the SOI substrate. The Si NMs were further etched by RIE with sulfur hexafluoride (SF$_6$) gas under low pressure (2 mtorr) to make 250 nm deep stiff sidewall trenches. Then, using conventional photolithography, etching holes were defined and undercut on the imprinted top Si layer with diluted hydrofluoric acid (HF:H$_2$O=1:3 (volume ratio)) to release the Si NMs from the SOI handle layer. After drying the Si NMs, source/drain metal pads of Ti/Au (10 nm/150 nm) were deposited by an e-beam evaporator on top of the Si NM and then transferred together with the Si NMs onto the SU-8 coated PET substrate. Note that, after the transfer printing step, the source/drain metal pads and Si NMs were flipped and therefore, the source/drain metal pads were covered by the Si NMs. The Si NMs were patterned to define active regions using dry etching and, as a result, the source/drain metals underneath the Si NMs were exposed. Finally, gate dielectric and metal stacks (SiO: 100 nm and Ti/Au: 10/200 nm) were deposited and lifted off. I-V characteristics were obtained using an Agilent 4155B semiconductor parameter analyzer and RF characteristics were obtained from measured scattering (S-) parameters using an Agilent E8364A performance network analyzer. The "open" and "short" features were used for a de-embedding procedure to obtain the intrinsic RF characteristics of the device. The detailed de-embedding procedure can be found in elsewhere. (See, Zhou, H. et al. Fast flexible electronics with strained silicon nanomembranes. *Sci. Rep.* 3, 1291 (2013).)

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A field effect transistor comprising:
   a layer of single-crystalline inorganic semiconductor comprising a first sublayer in which the semiconductor is n-type doped or p-type doped and a second, oppositely doped sublayer adjacent to the first sublayer;
   a trench bisecting the first sublayer and extending into the second sublayer to provide a source region in the first sublayer on one side of the trench, a drain region in the first sublayer on the opposite side of the trench, and a channel region in the second sublayer above the trench, wherein the channel region has a length corresponding to the width of the trench;
   a gate dielectric disposed on the channel region;
   a gate contact disposed on the gate dielectric;
   a source contact in electrical communication with the source region; and
   a drain contact in electrical communication with the drain region.

2. The transistor of claim 1, wherein the first sublayer is n-type doped, the second sublayer is p-type doped, and the transistor is a p-channel radiofrequency transistor.

3. The transistor of claim 2, wherein the width of the trench is in the range from about 10 nm to about 1 μm.

4. The transistor of claim 3, wherein the thickness of the p-type doped sublayer above the trench is in the range from about 5 nm to about 80 nm.

5. The transistor of claim 4, wherein the layer of single-crystalline inorganic semiconductor has a thickness of no greater than about 1 μm.

6. The transistor of claim 2, wherein the width of the trench is in the range from about 400 nm to about 600 nm, the thickness of the p-type doped sublayer above the trench is in the range from about 5 to about 40 nm, and the layer of single-crystalline inorganic semiconductor is a layer of single-crystalline silicon having a thickness of no greater than about 300 nm.

7. The transistor of claim 1, wherein the length of the gate dielectric is at least twice the width of the trench.

8. The transistor of claim 1, wherein the semiconductor is a group IV semiconductor.

9. The transistor of claim 1, wherein the semiconductor is a group III-V semiconductor.

10. The transistor of claim 1, wherein the first sublayer is n-type doped, the second sublayer is p-type doped, and the transistor is an n-channel transistor.

11. A method of making a field effect transistor, the method comprising:
    forming a layer of single-crystalline inorganic semiconductor comprising: a first sublayer in which the semiconductor is n-type doped or p-type doped; and a second, oppositely doped sublayer adjacent to the first sublayer;
    forming a trench in the layer of single-crystalline inorganic semiconductor, wherein the trench bisects the first sublayer and extends into the second sublayer to provide a source region in the first sublayer on one side of the trench, a drain region in the first sublayer on the opposite side of the trench, and a channel region in the second sublayer above the trench, wherein the channel region has a length corresponding to the width of the trench;
    forming a gate dielectric on the channel region;
    forming a gate contact on the gate dielectric;
    forming a source contact in electrical communication with the source region; and
    forming a drain contact in electrical communication with the drain region.

12. The method of claim 11, wherein the trench is formed using nanoimprint lithography.

13. The method of claim 11, wherein the layer of single-crystalline inorganic semiconductor is an n-type or p-type doped device layer of a semiconductor-on-insulator substrate comprising the device layer, a handle layer, and sacrificial layer separating the handle layer from the device layer and further wherein the step of forming the layer of single-crystalline inorganic semiconductor comprising the first and second sublayers comprises doping the doped device layer with the opposite dopant to form a p-doped or n-doped sublayer in the device layer and releasing the device layer from the handle layer by removing the sacrificial layer.

14. The method of claim 13, wherein the trench is formed using nanoimprint lithography.

15. The method of claim 11, wherein the first sublayer is n-type doped and the second sublayer is p-type doped and the transistor is a n-channel radiofrequency transistor.

16. The method of claim 15, wherein the width of the trench is in the range from about 10 nm to about 1 μm.

17. The method of claim 16, wherein the thickness of the p-type doped sublayer above the trench is in the range from about 5 nm to about 80 nm.

18. The method of claim 17, wherein the layer of single-crystalline inorganic semiconductor has a thickness of no greater than about 1 μm.

19. The method of claim 15, wherein the width of the trench is in the range from about 400 nm to about 600 nm, the thickness of the p-type doped sublayer above the trench is in the range from about 5 to about 40 nm, and the layer of single-crystalline inorganic semiconductor is a layer of single-crystalline silicon having a thickness of no greater than about 300 nm.

* * * * *